(12) United States Patent
Ruffell

(10) Patent No.: US 10,109,494 B2
(45) Date of Patent: Oct. 23, 2018

(54) FINFET SPACER ETCH WITH NO FIN RECESS AND NO GATE-SPACER PULL-DOWN

(71) Applicant: Varian Semiconductor Equipment Associates, Inc., Gloucester, MA (US)

(72) Inventor: Simon Ruffell, South Hamilton, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 22 days.

(21) Appl. No.: 15/414,883

(22) Filed: Jan. 25, 2017

(65) Prior Publication Data
US 2017/0133491 A1  May 11, 2017

Related U.S. Application Data

(63) Continuation of application No. 14/749,020, filed on Jun. 24, 2015, now Pat. No. 9,589,811.

(51) Int. Cl.
*H01L 21/3065* (2006.01)
*H01L 29/66* (2006.01)
(Continued)

(52) U.S. Cl.
CPC .... *H01L 21/3065* (2013.01); *H01L 21/26586* (2013.01); *H01L 21/283* (2013.01);
(Continued)

(58) Field of Classification Search
None
See application file for complete search history.

(56) References Cited

U.S. PATENT DOCUMENTS 5,459,354 A * 10/1995 Hara .................... H01L 23/485
257/383
6,979,632 B1  12/2005 Ohtani et al.
(Continued)

FOREIGN PATENT DOCUMENTS

JP   H09232431 A   9/1997
WO  2014110379 A1  7/2014

OTHER PUBLICATIONS

Blanc et al., "Patterning of Silicon Nitride for CMOS Gate Spacer Technology. I. Mechanisims involved in the silicon consumption in CH3F/O2/He high density plasmas", J Vacuum Sci & Tech B, 51801-1-51801-4, vol. 31, AVS; Science & Technology of Materials, Interfaces, and Processing (2013).
(Continued)

*Primary Examiner* — Eva Y Montalvo
*Assistant Examiner* — Kevin Quinto

(57) ABSTRACT

A method may include providing a patterned feature extending from a substrate plane of a substrate, the patterned feature including a semiconductor portion and a coating in an unhardened state extending along a top region and along sidewall regions of the semiconductor portion; implanting first ions into the coating, the first ions having a first trajectory along a perpendicular to the substrate plane, wherein the first ions form a etch-hardened portion comprising a hardened state disposed along the top region; and directing a reactive etch using second ions at the coating, the second ions having a second trajectory forming a non-zero angle with respect to the perpendicular, wherein the reactive etch removes the etch-hardened portion at a first etch rate, wherein the first etch rate is less than a second etch rate when the second ions are directed in the reactive etch to the top portion in the unhardened state.

18 Claims, 6 Drawing Sheets

(51) Int. Cl.
  *H01L 21/283* (2006.01)
  *H01L 29/161* (2006.01)
  *H01L 29/10* (2006.01)
  *H01L 21/3115* (2006.01)
  *H01L 21/311* (2006.01)
  *H01L 21/265* (2006.01)
  *H01L 21/308* (2006.01)
  *H01L 29/165* (2006.01)

(52) U.S. Cl.
  CPC ...... *H01L 21/3081* (2013.01); *H01L 21/3086* (2013.01); *H01L 21/31116* (2013.01); *H01L 21/31155* (2013.01); *H01L 29/1033* (2013.01); *H01L 29/1054* (2013.01); *H01L 29/161* (2013.01); *H01L 29/165* (2013.01); *H01L 29/6656* (2013.01); *H01L 29/66553* (2013.01); *H01L 29/66795* (2013.01)

(56) References Cited

U.S. PATENT DOCUMENTS

| | | | |
|---|---|---|---|
| 7,790,621 | B2 | 9/2010 | Wen |
| 9,589,811 | B2* | 3/2017 | Ruffell ............... H01L 21/3065 |
| 2002/0139773 | A1 | 10/2002 | Gabriel et al. |
| 2004/0145019 | A1 | 7/2004 | Dakshina-Murthy et al. |
| 2011/0021027 | A1* | 1/2011 | Johnson ............. H01L 21/3086 438/694 |
| 2014/0080276 | A1* | 3/2014 | Brand ............... H01L 29/66803 438/283 |
| 2014/0151766 | A1 | 6/2014 | Eneman et al. |
| 2015/0083581 | A1 | 3/2015 | Sherman et al. |
| 2015/0325686 | A1* | 11/2015 | Allibert ............. H01L 29/66795 438/199 |
| 2016/0104799 | A1* | 4/2016 | Qi ...................... H01L 29/7849 257/29 |

OTHER PUBLICATIONS

Sun et al., "Selective Enhancement of SiO2 Etch Rate by Ar-Ion Implantation for Improved Etch Depth Control"; Electrochem. Solid-State Lett. 10(9):D89-D91 (2007).

Charavel et al., "Etch Rate Modification of SiO2 by Ion Damage"; Electrochem. Solid-State Lett. 9(7):G245-G247 (2006).

Blanc et al., "Patterning of Silicon Nitride for CMOS Gale Spacer Technology. II. Impact of subsilicon surface carbon implantation on epitaxial regrowth", J Vacuum Sci & Tech B, 21806-1-21806-7, vol. 32, AVS; Science & Technology of Materials, Interfaces, and Processing (2014).

North et al., "Tapered Windows in Phosphorus-Doped SiO2 by Ion Implantation"; IEEE Transactions on Electron Devices, ED-25(7):809-812 (1978), IEEE.

Lee et al., "Ultrahigh Selective Etching of Si 3 N 4 Films over Si O 2 films for silicon nitride gate spacer etching", J Vacuum Sci & Tech B, 131-137, vol. 28, AVS; Science & Technology of Materials, Interfaces, and Processing (2010).

Ofan et al., "Origin of highly spatially selective etching in deeply implanted complex oxides"; Applied Physics Letters 93:181906-1-181906-3 (2008).

* cited by examiner

| SLOT | SPECIES | DOSE(CM$^{-2}$) | AMOUNT ETCHED (nm) |
|---|---|---|---|
| UNPROCESSED | | | 15 |
| 1 | O | $1\times10^{15}$ | 21 |
| 2 | O | $5\times10^{15}$ | 18 |
| 3 | O | $1\times10^{16}$ | 7 |
| 4 | O | $5\times10^{16}$ | 2 |
| 5 | Si | $1\times10^{15}$ | 13 |
| 6 | Si | $5\times10^{15}$ | 2 |
| 7 | Si | $1\times10^{16}$ | 1 |
| 8 | Si | $5\times10^{16}$ | 4 |

PROVIDING PATTERNED FEATURE EXTENDING FROM SUBSTRATE PLANE OF SUBSTRATE, WHEREIN PATTERNED FEATURE INCLUDING SEMICONDUCTOR PORTION AND COATING IN AN UNHARDENED STATE, WHEREIN COATING EXTENDING ALONG TOP REGION AND INCLUDING SIDEWALL PORTION ALONG SIDEWALL REGIONS OF SEMICONDUCTOR PORTION
602

↓

IMPLANTING FIRST IONS INTO COATING, THE FIRST IONS HAVING FIRST TRAJECTORY ALONG PERPENDICULAR TO SUBSTRATE PLANE, WHEREIN IONS FORM ETCH-HARDENED PORTION COMPRISING HARDENED STATE OF COATING DISPOSED ALONG TOP REGION
604

↓

DIRECTING REACTIVE ETCH USING SECOND IONS AT COATING, WHEREIN SECOND IONS HAVING SECOND TRAJECTORY FORMING NON-ZERO ANGLE WITH RESPECT TO PERPENDICULAR, WHEREIN REACTIVE ETCH REMOVES ETCH-HARDENED PORTION AT FIRST ETCH RATE, WHEREIN FIRST ETCH RATE IS LESS THAN SECOND ETCH RATE WHEN SECOND IONS ARE DIRECTED IN REACTIVE ETCH TO TOP REGION OF COATING IN UNHARDENED STATE
606

*FIG. 6*

FINFET SPACER ETCH WITH NO FIN RECESS AND NO GATE-SPACER PULL-DOWN

CROSS-REFERENCE TO RELATED APPLICATION

This application claims priority to, and is a continuation of U.S. patent application Ser. No. 14/749,020, filed Jun. 24, 2015, entitled "FINFET SPACER ETCH WITH NO FIN RECESS AND NO GATE-SPACER PULL-DOWN" and incorporated by reference herein it its entirety.

FIELD

The present embodiments relate to transistor processing techniques, and more particularly, to processing for three dimensional device formation.

BACKGROUND

In the present day many approaches are investigated to improve performance of semiconductor devices, including dimensional scaling to reduce overall device dimensions. Additionally, silicon based transistors including planar or three dimensional devices may be modified by the use of additional material such as silicon:germanium alloys (SiGe) or compound semiconductors such as InAs or other 3:5 compound semiconductors. Further attempts to improve device performance include the introduction of strain into a transistor channel to increase carrier mobility.

In the case of N-type metal oxide semiconductor field effect transistors (NMOS), no straightforward process to introduce significant strain in the transistor channel has been achieved. One possible route for fabrication of strained transistor channels in NMOS is the use of a SiGe strain relaxed buffer (SRB) layer. This SRB layer is a layer of relaxed SiGe material. Silicon may then be epitaxially grown on the SRB layer. Because of the lattice mismatch between silicon and SiGe, strain is introduced into the silicon grown on the SRB layer. This approach may be employed, for example, in three dimensional transistors, such as fin-type field effect transistors (finFETs). If a finFET device is subsequently fabricated within this strained Si layer the devices may have improved performance due to increased electron mobility imparted into a transistor channel forming part of the finFET device.

In order to capture the potential improvement in device performance in such finFET devices, care may be useful to ensure proper treatment of sidewalls formed on a fin structure of a finFET or sidewalls formed on a gate structure. For example, during a spacer etch operation to process the finFET device according to known process flow, the silicon fin is to be left intact, so strain within the silicon fin is not relieved in the channel region. In addition, during the etching process to form sidewalls on fin structures, sidewall material deposited on the gate structure is also etched. The pulldown of sidewalls formed on the gate structure is to be kept at an acceptable level or avoided in order to reduce gate loss during processing.

It is with respect to these and other considerations the present disclosure is provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method of processing a three dimensional device may include providing a patterned feature extending from a substrate plane of a substrate, the patterned feature including a semiconductor portion and a coating in an unhardened state extending along a top region and along sidewall regions of the semiconductor portion; implanting first ions into the coating, the first ions having a first trajectory along a perpendicular to the substrate plane, wherein the first ions form a etch-hardened portion comprising a hardened state of the coating disposed along the top region; and directing a reactive etch using second ions at the coating, the second ions having a second trajectory forming a non-zero angle with respect to the perpendicular, wherein the reactive etch removes the etch-hardened portion at a first etch rate, wherein the first etch rate is less than a second etch rate when the second ions are directed in the reactive etch to the top portion of the coating in the unhardened state.

In another embodiment, a method of processing a finFET device may include providing a coated device structure, the coated device structure comprising a fin structure extending from a substrate plane of a substrate, a gate structure covering a first portion of the fin structure, and a coating covering the gate structure and covering a second portion of the fin structure not covered by the gate structure; implanting first ions into the coating, the first ions having a first trajectory along a perpendicular to the substrate plane, wherein the first ions form a first etch-hardened portion of the coating disposed along a first top surface of the fin structure and a second etch-hardened portion of the coating disposed along a second top surface of the gate structure; and directing a reactive etch using second ions at the coating, the second ions having a second trajectory forming a non-zero angle with respect to the perpendicular, wherein the second ions remove the first etch-hardened portion, the second etch-hardened portion and a sidewall portion of the first layer disposed on fin sidewalls of the fin structure, while a semiconductor portion of the fin structure is not etched.

In a further embodiment, a method of forming a finFET device may include providing a fin structure extending from a substrate plane of a substrate, the fin structure comprising a fin made of strained silicon having an initial strain state, and a coating extending along a top region and sidewall regions of the fin; implanting first ions into the coating, the first ions having a first trajectory along a perpendicular to the substrate plane, wherein the first ions form a etch-hardened portion of the coating, the etch-hardened portion disposed along the top region and formed in a hardened state; and directing a reactive etch comprising second ions at the fin structure, the second ions having a second trajectory forming a non-zero angle with respect to the perpendicular, wherein the reactive etch removes the etch-hardened portion and the sidewall portion of the coating while not etching the fin, wherein an exposed fin is formed having a final strain state equal to the initial strain state.

BRIEF DESCRIPTION OF THE DRAWINGS

FIG. 2 provides experimental etch rate data showing etch rate of a silicon nitride layer;

FIG. 6 depicts an exemplary process flow.

DETAILED DESCRIPTION

Figure 1A:
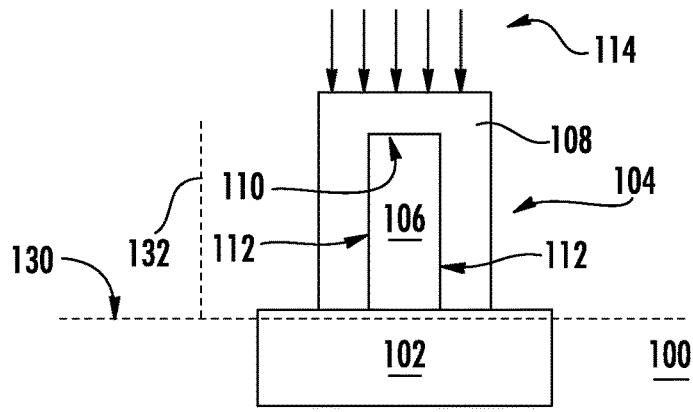
FIGS. 1A-1F depict a side view in cross-section of a three dimensional device, during various stages of processing in accordance with embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The embodiments described herein provide novel techniques to process three dimensional devices. Various embodiments provide techniques to improve three dimensional device structure and performance. Particular embodiments involve techniques to preserve semiconductor fins in fin-type field effect transistors (finFETs). As detailed below, various embodiments entail treating a three dimensional device using multiple ion treatment operations.

FIGS. 1A-1F depict a side view of a three dimensional device, shown as device 100 during various stages of processing in accordance with embodiments of the disclosure. The device 100 may represent a portion of a finFET or similar device where a transistor channel may be gated on multiple sides. The device 100 includes a base 102 where the base 102 may be a semiconductor material as discussed below. The device 100 may be defined by a substrate plane 130 lying in the X-Y plane of the Cartesian coordinate system shown. The device 100 may include at least one patterned feature extending from the substrate plane 130. In the example of FIG. 1A, the patterned feature is a fin structure 104 disposed on the base 102. The fin structure 104 includes a fin 106 and a coating 108. The coating 108 may be disposed along a top region 110 and sidewall regions 112 of the fin 106.

The device 100 as shown in FIG. 1A is representative of a three dimensional device such as a finFET at a stage of processing after formation of fins to be used to form transistor channels. The coating 108 may be used as spacer material for sidewall spacers in portions of a finFET as described below. During processing of a finFET, the fin 106 may be subject to ion implantation, as well as growth of semiconductor material on the fin 106 in order to form source/drain (S/D) regions. In known approaches, in order to prepare a fin such as the fin structure 104 for such processing operations, a coating such as the coating 108 is first removed. By way of background, in a conventional process the coating 108 may be removed by directing ions along the Z-axis as shown, where the ions selectively etch the coating 108 with respect to the fin 106. Because in such known approaches the ions are directed along the Z-axis etching of the coating 108 is not complete until ions etch the coating vertically to the bottom of the fin structure 104 at the base 102. This etching may result in removal of 10 percent, 25 percent, or more of the height of the fin structure 104 along the Z-axis, for example. In addition, as discussed below, in a finFET device, a gate spacer may be undesirably etched vertically down a gate sidewall of a gate structure.

In the embodiment of FIGS. 1A-1F, a novel set of processing operations is disclosed to avoid loss of portions of the fin 106 during removal of the coating 108. Returning now to FIG. 1A, there is shown an operation involving implanting first ions 114 into the coating 108. The first ions 114 may be directed to the device 100 so the trajectory of the first ions 114 lies along a perpendicular 132 to the substrate plane 130, i.e., along the Z-axis as shown. The first ions 114 may be provided by a suitable processing apparatus such as a beamline ion implanter, plasma deposition tool (PLAD), or other processing apparatus. In various embodiments, the first ions 114 may be selected to alter a portion of the coating 108 so as to change the etch characteristics of the portion of coating 108. In various embodiments, a combination of the species of first ions 114, the trajectory of first ions 114, ion energy of first ions 114, and ion dose of first ions 114 may be selected to generate an etch-hardened portion of the coating 108 disposed along the top region 110 of the fin 106. These parameters of the first ions 114 may be selected in conjunction with the thickness and composition of the coating 108 to produce the etch-hardened portion. The term "etch-hardened portion" as used herein refers to an etch-hardened material, meaning the etch-hardened portion etches less rapidly when subject to a given etchant than in other portions of the coating 108 in an unhardened state.

Figure 1B:
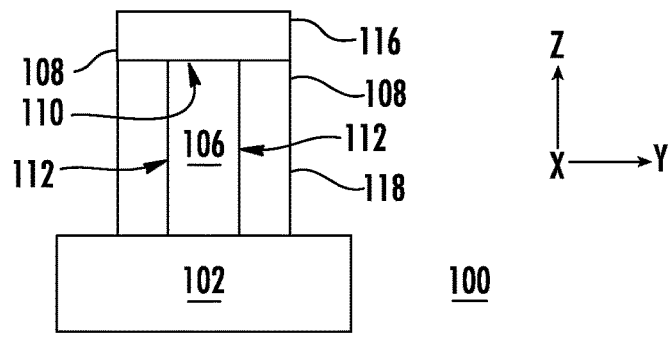

Because the first ions 114 may be directed along the Z-axis, the first ions 114 may not impinge upon the sidewall regions 112. Accordingly, as shown in FIG. 1B, by proper choice of ion energy and ion dose, an etch-hardened portion 116 of the coating 108 may be formed in the portion of the coating 108 disposed along the top region 110 of the fin 106.

Figure 1C:
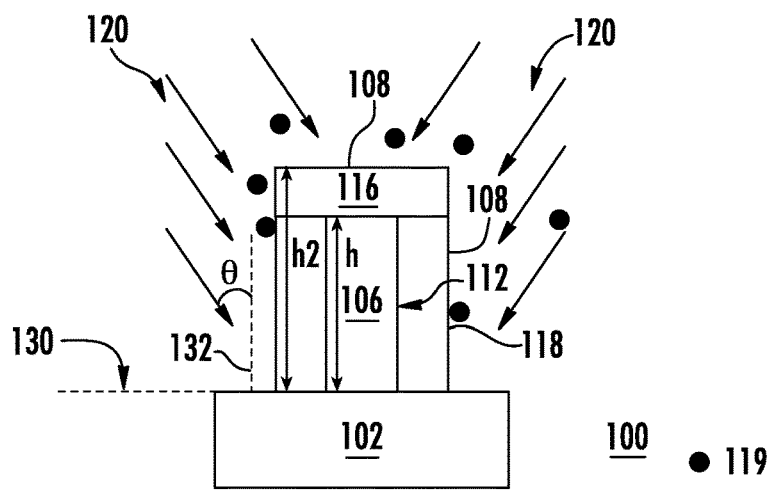
Figure 1D:
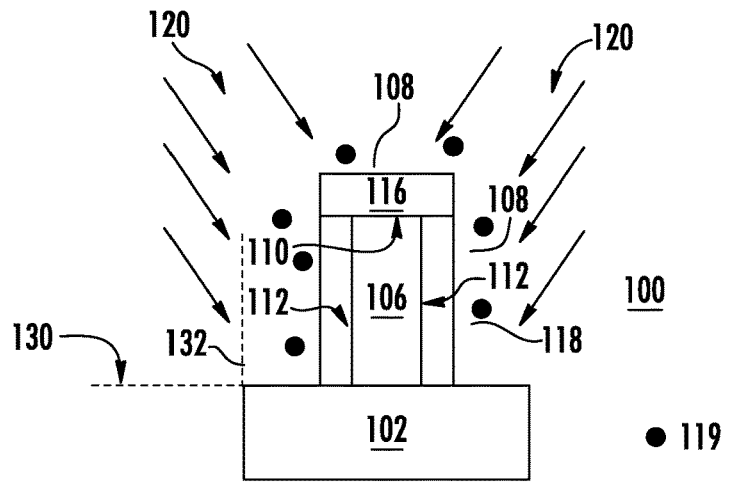
Figure 1E:
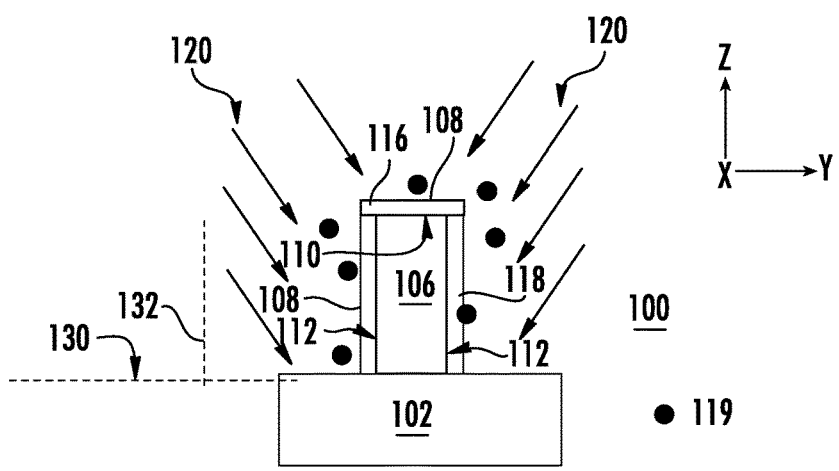

Turning now to FIGS. 1C-1E, there is shown a subsequent operation involving the directing of second ions 120 to the coating 108. The different scenarios shown in FIGS. 1C, 1D, and 1E may represent different instances during just one operation. The second ions 120 are directed at a non-zero angle, shown as the angle θ, with respect to the perpendicular 132. In accordance with some embodiments, the operation depicted in FIG. 1C may be performed in two operations, where a first operation involves directing second ions 120 to a sidewall region 112 to the left of the fin 106 in the FIG. 1C. A second operation may then involve directing second ions 120 to a sidewall region 112 to the right of the fin 106 in the FIG. 1C.

As illustrated in FIG. 1C, the sidewall regions 112 may extend within the X-Z plane, while the second ions 120 may have trajectories lying within the Y-Z plane, so the second ions lie within a plane perpendicular to a plane of the sidewall regions 112. This allows the sidewall regions 112 to be impacted uniformly by the second ions 120 along the X-axis. Additionally, the angle θ may be adjusted to avoid shadowing by any structures such as adjacent fin structures (not shown).

In other embodiments, the sidewall region 112 to the left and to the right of fin 106 may be exposed to second ions 120 at the same time. For example, known processing apparatus may provide two ion beams simultaneously from a plasma chamber by extracting the ion beams through an extraction plate having a pair of apertures directing the second ions 120 in different directions as shown. In particular, the ions extracted from one aperture may be directed as shown to the left of fin 106 and ions extracted from the other aperture may be directed as shown to the right of fin 106. In this manner, the sidewall regions 112 may be treated in one operation, as depicted in FIGS. 1C, and 1D, 1E to follow.

In some embodiments, the trajectories, ion energy, ion species, and ion dose of second ions 120 to the right of the fin 106 may be the same as the trajectories, ion energy, ion species, and ion dose of second ions 120 to the left of fin 106. The second ions 120 may form part of a reactive etch, where the reactive etch is directed to the fin 106 as second ions 120 and a reactive species 119. In some examples, the second ions 120 may comprise at least one ion species capable of selectively etching the coating 108 with respect to the fin 106, and the base 102. As illustrated in the embodiment of FIG. 1C, the reactive species 119, shown as dark circles, may be provided in conjunction with the second ions 120 as part of a reactive etch to perform selective etching of the coating 108. In some examples the reactive species 119 may include neutrals, radicals, reactive ions, and other reactive species.

In some embodiments, the fin 106 may be monocrystalline silicon or another monocrystalline semiconductor. The coating 108 may be a silicon nitride material or silicon oxynitride material or silicon oxy-carbon-nitride material. The embodiments are not limited in this context. In particular embodiments, the second ions 120 may comprise known species capable of selectively etching silicon nitride or silicon oxynitride with respect to silicon, and with respect to silicon oxide, silicon:germanium, and other materials. In some embodiments, the reactive species 119 and second ions 120 may constitute a known reactive ion etching mixture for selectively etching a given coating, such as silicon nitride, with respect to silicon or other materials. Accordingly, during the operation shown in FIGS. 1C-1E, the coating 108 may be selectively etched with respect to the fin 106 and the base 102.

As shown in the figures, at this stage the coating 108 includes the etch-hardened portion 116, and sidewall portions 118 disposed along the sidewall regions 112. The sidewall portions 118 may be in an unhardened state. In various embodiments, the etch-hardened portion 116 may be designed so the coating 108 may be removed while the fin 106 is preserved. For example, the etch-hardened portion 116 may be designed so a specific set of conditions for second ions 120 and reactive species 119 results in removal of the coating 108 from the top region 110 and sidewall regions 112 while the height h of fin 106 remains the same. The second ions 120 and reactive species 119 may etch the sidewall portions 118 at a first etch rate, while the second ions 120 and reactive species 119 etch the etch-hardened portion 116 at a second etch rate. In particular, the second etch rate may be less than a third etch rate resulting when a top region of the coating 108 in an unhardened state in the position of the etch-hardened portion 116 is etched by the second ions. Such a third etch rate would result from known processing techniques where an unimplanted coating of the coating 108 may be etched by ions.

Figure 1F:
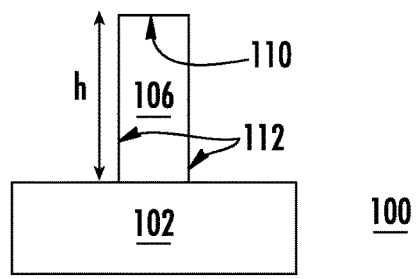

In various embodiments, the relatively lower etch rate provided by the etch-hardened portion 116 in comparison to an unhardened state of coating 108 in the same position allows the sidewall portions 118 to be removed by the time the etch-hardened portion 116 is removed. Accordingly, the operation depicted in FIGS. 1C to 1E may cease when removal of sidewall portions 118 is complete. By carefully adjusting etch parameters such as ion species of second ions 120, angle of incidence of second ions 120 with respect to perpendicular 132, as well as the aforementioned characteristics of coating 108 and first ions 114, the completion of removal of etch-hardened portion 116 make occur at the same instance as completion of removal of the sidewalls portions 118. Since the operation of FIGS. 1C to 1E may cease at this instance, the fin 106 may remain intact with no loss in height h, as shown in FIG. 1F.

As noted, in some embodiments, the etch rate of the etch-hardened portion 116 may be tailored so the completion of the removal of etch-hardened portion 116 occurs at the same time (same instance) as the completion of removal of the sidewall portions 118. In accordance with various embodiments, the etch rate of the etch-hardened portion 116 may be tailored according to the ion dose or ion species implanted into the coating 108. In some examples, the coating 108 may be silicon nitride formed by a known technique. The etch rate of silicon nitride material disposed on the sidewall portions 118 may be known or calculated or measured under a given set of conditions for providing the second ions 120 to the device 100. The present embodiments may take advantage of the ability to direct ions to the sidewall regions 112 at a non-zero angle of incidence with respect to the perpendicular 132, shown as the angle θ in FIG. 1C. In some embodiments, the angle θ is between 10 degrees and 60 degrees with respect to the perpendicular 132. This allows the sidewall portions 118 to be etched to the extent ions 120 are not shadowed by adjacent fin structures (not shown in the FIGs.). In some instances, the spacing between adjacent fin structures along the y-axis may be less than the height h2 of the fin structure 104. In these instances, the angle of incidence as defined by the angle θ may be less than 45, and in some examples may be 10 to 20 degrees. Using an angle of incidence of 15 degrees, for example, the etch rate of sidewall portions 118 may be determined to determine an etch duration for complete removal of the sidewall portions 118. The etch rate of the etch-hardened portion 116 may be tailored accordingly.

In some embodiments, for a given thickness of the coating 108 the ion dose of first ions 114 may be tailored to generate a target etch rate of the etch-hardened portion 116. The target etch rate of the etch-hardened portion 116 may be based upon the etch rate of the sidewall portions 118, as discussed above. The target etch rate of etch-hardened portion 116 may be an etch rate wherein the etch-hardened portion 116 is not completely removed before the sidewall portions 118 are completely removed. The target etch rate may be an etch rate wherein completion of the removing of the sidewall portion 118 occurs at a same instance as completion of the removing of the etch-hardened portion 116. In other embodiments, the target etch rate may be an etch rate wherein completion of removal of the sidewall portions 118 occurs before the completion of removal of the etch-hardened portion 116. A remaining portion of the etch-hardened portion 116 may then be removed by any convenient etch process, selectively removing the etch-hardened portion 116 to leave the fin 106 unetched.

FIG. 2 provides experimental etch rate data showing etch rate of a silicon nitride layer, where the silicon nitride layer may be used as the coating 108. The etch rate data illustrates etch rate of a silicon nitride layer under different exposures to first ions 114 in the operation illustrated in FIG. 1A. The data of FIG. 2 is based upon etching performed on silicon nitride layers using a known etch recipe for selectively etching silicon nitride material with respect to other materials such as silicon or silicon oxide. In particular, the etching data is from a $CH_3F$-based reactive etch process of silicon nitride. Reactive species formed in such an etch process may include neutrals or ions of C, F, H, CHx, CFx, for example.

The etch rate data is actually shown as a total thickness of silicon nitride removed for a given etch time, equivalent to an etch rate when divided by the etch time. A given datum is based on the same etch time as other data so the relative thickness of material removed between different samples is directly proportional to the relative difference in etch rate of the different samples. The datum for slot 1 indicates the thickness of silicon nitride removed when an unhardened silicon nitride layer is etched. In other words, with respect to FIGS. 1A-1F, the datum in slot 1 represents etch rate of the coating 108 using ions such as second ions 120 when the coating 108 is not previously exposed to the first ions 114.

For the data shown for slots 2, slot 3, and slot 4, the silicon nitride layer is exposed to oxygen ion implantation before etching. Accordingly, the data shown for slots 2-4 represents an example where the etch-hardened portion 116 is silicon nitride implanted with first ions 114, where the first ions 114 are oxygen ions. As illustrated for slot 1, when a dose of $1E15/cm^2$ oxygen ions is implanted into the silicon nitride layer, the thickness of the resulting silicon nitride removed during subsequent etching increases somewhat to 21 nm. At a dose of $5E15/cm^2$ (slot 3) the thickness of silicon nitride layer removed is also somewhat higher (18 nm) than the thickness for unimplanted silicon nitride. At a dose of $1E16/cm^2$, the thickness of silicon nitride removed is much less, just 7 nm. At a dose of $5E16/cm^2$ the thickness of silicon nitride removed decreases further to just 2 nm.

The above results show ion implantation of silicon nitride layers using oxygen ions or silicon ions may adjust the etch rate of silicon nitride layers under known reactive etching conditions over a wide range of etch rates, such as approximately a factor of 10. Accordingly, the etch rate of an etch-hardened portion 116 may be adjusted to a target rate allowing the completion of removal of the etch-hardened portion 116 to coincide with completion of removal of sidewall portions 118.

In the above manner, by providing angled ions forming a non-zero angle of incidence with respect to the perpendicular 132, and by providing a etch-hardened portion 116, the coating 108 may be removed from the fin structure 104 while not damaging underlying semiconductor material such as the fin 106. The ability to preserve the fin structure 104 may be especially useful in embodiments where the fin 106 is composed of strain silicon. For example, the fin 106 may be formed in a strained state constituting a strained silicon fin. The strained state may increase carrier mobility in a transistor channel to be formed within the fin 106. In one example the fin 106 may be used to form an N-type finFET. One manner of forming an N-type finFET having a strained channel is to grow a monocrystalline layer of silicon on a relaxed silicon germanium (SRB) layer. The SRB layer, by virtue of having a larger lattice parameter than silicon, may impart strain into a silicon layer grown on the SRB, layer, such as the fin 106. Accordingly, in one embodiment, the base 102 may be an SRB layer imparting a target level of strain into the fin 106. When a full transistor is subsequently formed, a channel region may be formed within a portion of the fin 106. In order to preserve strain in the channel region, preserving the height of the fin 106 may be useful. For example, the present inventor has observed the situation where decreasing the height of the fin 106 from an original value of h, results in a decrease in the level of strain in the silicon fin. This may result in the relaxation of strain in other regions of the fin 106. In the present embodiments, the preservation of the height h of the fin 106 may result in preserving strain throughout the fin 106 including in regions to form a transistor channel. This results in preserving a higher mobility for the channel, such as in an N-type device.

Figure 3:
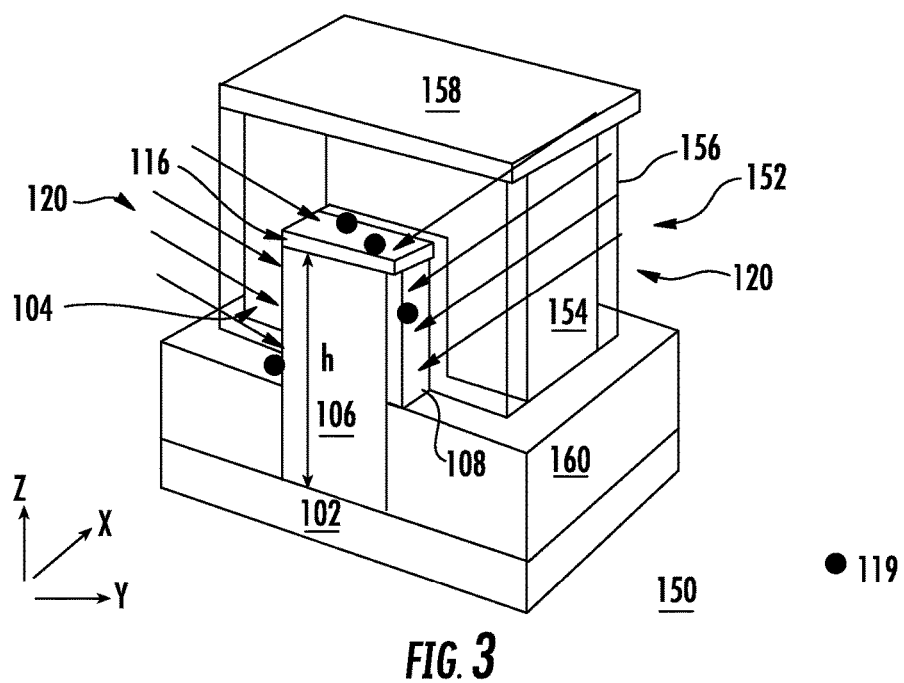
FIG. 3 depicts processing of an exemplary device according to embodiments of the disclosure.

FIG. 3 depicts an exemplary device, shown as device 150, including the base 102, fin 106 and coating 108 as described above. The device 150 further includes a gate structure 152 surrounding a portion of the gate structure 104, in this case on three sides of the gate structure 152, as in known finFET devices. The gate structure 152 includes a gate 154 and sidewalls 156. In accordance with various embodiments, the first ions 114 described previously may be directed at the device 150, forming the etch-hardened portion 116, as well as a second etch-hardened portion 158, discussed later. When the second ions 120 are directed to the device 150, the second ions 120 may remove the coating 108 surrounding the fin 106, as discussed above with respect to FIGS. 1A to 1F, while preserving the height h of the fin 106. When the base 102 is an SRB layer, the fin 106 may be strained, as noted. By preserving the height h of the fin 106, the strain within region of the fin 106 covered by the gate structure 152 where a channel may be formed. This allows a high mobility to be preserved in such a channel region, providing a technique for forming a high mobility N-type finFET for example.

The above experimental examples of FIG. 2 are merely exemplary, and other combinations of ion dose and film thickness, as well as film composition may generate similar results. In particular, the ion dose, as well as ion energy may be adjusted according to the thickness of a coating 108 to be implanted in order to generate a target etch rate for the etch-hardened portion 116. In particular, and without limitation, for a given etch recipe the etch rate of an implanted coating such as implanted silicon nitride layer, may depend on the overall fraction of implanted species in the implanted layer. For example, the etch rate of a silicon nitride layer implanted with oxygen may depend upon the atomic percent of oxygen in the implanted silicon nitride layer. In some examples, implanting oxygen to generate an atomic fraction of oxygen of 5% to 60% within a silicon nitride layer may be used to reduce the etch rate. In one example, implanting oxygen to generate an atomic fraction of oxygen of 25% to 35% within a silicon nitride layer may reduce the etch rate of the implanted layer by more than a factor of two with respect to unimplanted silicon nitride. Accordingly, ion dose as well as ion energy may be adjusted according to the thickness of a silicon nitride layer to generate an atomic fraction of oxygen of 30%, for example. Notably, the implanted oxygen need not be uniformly distributed through the silicon nitride layer as a function of depth in order to reduce etch rate.

In particular embodiments, where the coating 108 comprises silicon nitride or silicon oxynitride having a thickness in the range of 2 nm to 20 nm, oxygen ions may be implanted at an ion energy of between 250 eV and 1000 eV and at an ion dose of between 5 E $5E14/cm^2$ and $5E16/cm^2$. In other embodiments, where the coating 108 comprises silicon nitride or silicon oxynitride having a thickness in the range of 2 nm to 20 nm, silicon ions may be implanted at an ion energy of between 250 eV and 1000 eV and at an ion dose of between $2E15/cm^2$ and $2E16/cm.^2$ The embodiments are not limited in this context.

Figure 4:
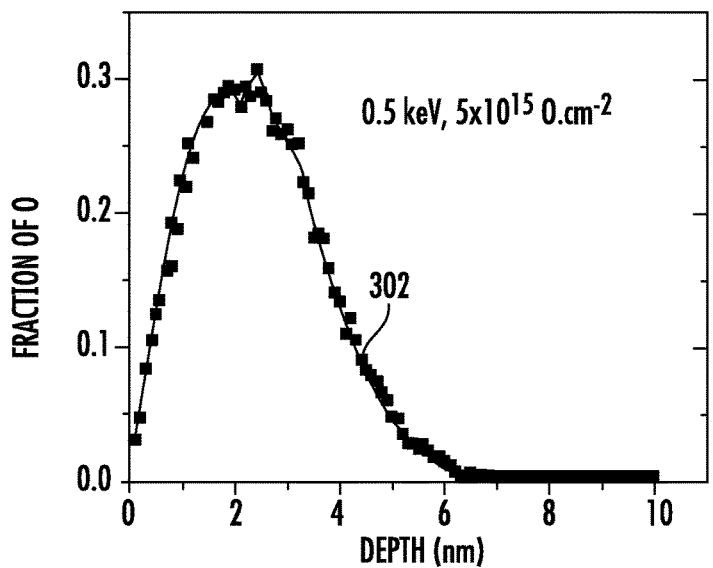
FIG. 4 illustrates a compositional curve showing the results of implantation of a silicon nitride layer with oxygen ions according to an embodiment of the disclosure.

In some embodiments, the implantation energy of implanting ions such as the second ions 120 may be tailored according to the thickness of the coating 108 in order to protect an underlying structure such as the fin 106. For example, the second ions 120 may be implanted as oxygen ions or silicon ions to an implant depth where the implant depth represents a distance below an outer surface of the coating 108, where 99% of the implanted species are located between the outer surface and the implant depth. The implant depth according to various embodiments may be arranged so a ratio of implant depth to coating thickness of the coating 108 is 0.1 to 1.0, and is particular examples ranges between 0.3 and 0.6. This may ensure implanting ions do not damage an underlying fin located at the inner surface of the coating 108. FIG. 4 illustrates a compositional curve 402 showing the results of implantation of a silicon nitride layer with oxygen ions according to an embodiment of the disclosure. In this example, the silicon nitride layer is implanted with 500 eV oxygen ions at a dose of 5 E15/cm2 oxygen ions. As illustrated, the atomic fraction of oxygen reaches a peak of 0.3 (30%) in a range of 1.6 nm to 2.6 nm below the outer surface of the silicon nitride layer (at zero nm depth). At 6.2 nm depth the atomic fraction of oxygen drops to zero, indicating oxygen is not implanted below this depth. The implant depth in this example may be deemed to be 5.6 nm where approximately 99% of oxygen is implanted at or below 5.6 nm. The aforementioned ion implantation conditions generating the compositional curve 302 may be appropriate for silicon nitride thickness of 10 nm, for example to ensure oxygen ions do not damage an underlying fin. For grater film thickness, greater ion energy, greater ion dose, or a combination of the two may be acceptable for generating a hardened film. In other embodiments an etch-hardened portion may comprise a peak atomic oxygen concentration of 5 percent to 60 percent.

Figure 5A:
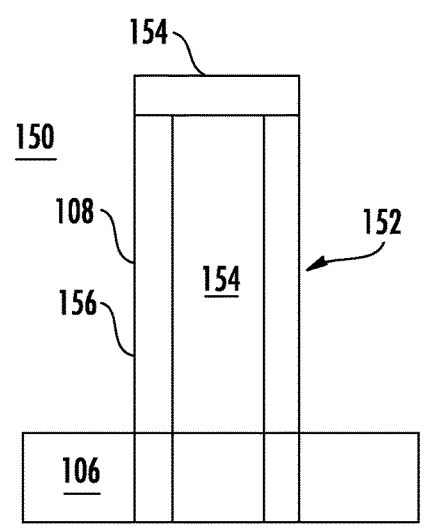
FIGS. 5A-5D depict an end view of the device of FIG. 3 during processing according to embodiments of the disclosure.
Figure 5B:
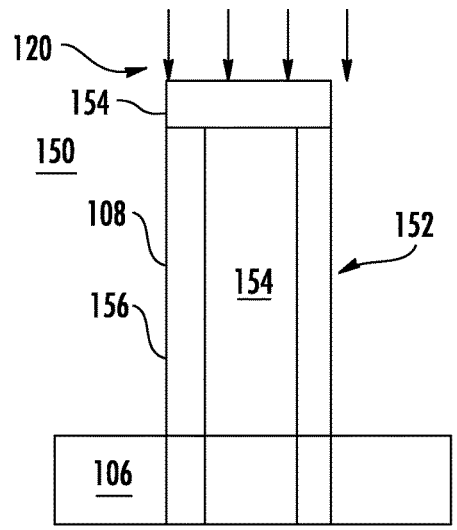
Figure 5C:
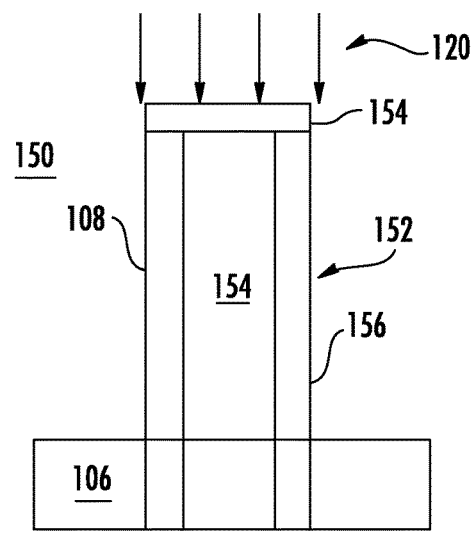
Figure 5D:
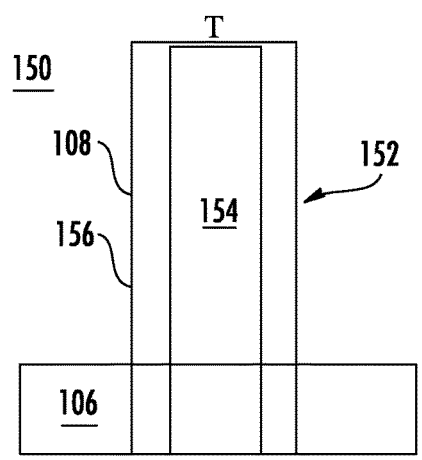

FIGS. 5A-5D depict an end view of the device 150 (in the X-Z plane) during processing according to embodiments of the disclosure. The device 150 may be processed according to the techniques disclosed above with respect to FIGS. 1A to 1D. In the instance depicted in FIG. 5A, a second etch-hardened portion 158 of the coating 108 has been formed on a top portion of the gate structure 152, corresponding to the instance depicted in FIG. 1B, for example. In FIGS. 5B to 5D there are shown a sequence of instances during exposure to the second ions 120. As illustrated, the second ions 120 may be directed along trajectories parallel to the Y-Z plane. In this manner, the second ions 120 may run parallel to the gate sidewalls, and may not strike the sidewalls 156, etching just the second etch-hardened portion 158. Because the second etch-hardened portion 158 etches at an etch rate less than an etch rate for an unhardened portion of coating 108, pull down of sidewalls from the gate structure 152 may be avoided, where pulldown represents etching sidewalls 156 below the top T of the gate 154.

FIG. 6 depicts an exemplary process flow 600. Block 602 includes providing a patterned feature extending from a substrate plane of a substrate. The patterned feature may include a semiconductor portion and coating in an unhardened state, wherein the coating extends along a top region and includes a sidewall portion along sidewall regions of the semiconductor portion. At block 604 first ions are implanted into the coating, wherein the first ions have a first trajectory along a perpendicular to the substrate plane, wherein the first ions form an etch-hardened portion comprising a hardened state of the coating disposed along the top region. At block 606 a reactive etch is directed at the coating using second ions, wherein the second ions have a second trajectory forming a non-zero angle with respect to the perpendicular. The reactive etch may remove the etch-hardened portion at a first etch rate, wherein the first etch rate is less than a second etch rate when the second ions are directed in the reactive etch to the top region of the coating in an unhardened state.

An advantage afforded by the present embodiments includes the ability to remove a layer of spacer material from a fin of a three dimensional device while not etching the fin, and preserving the height of the fin accordingly. Another advantage lies in the ability to preserve strain in such a fin structure by minimizing of eliminating the etching of the fin. A further advantage lies in the ability to preserve sidewall spacer material on a gate structure of a three dimensional device.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a finFET device, comprising:
    providing a fin structure extending from a substrate plane of a substrate, the fin structure comprising a fin made of strained silicon having an initial strain state, and a coating extending along a top region of the fin, the coating including a sidewall portion along sidewall regions of the fin;
    implanting first ions into the coating, the first ions having a first trajectory along a perpendicular to the substrate plane, wherein the first ions form an etch-hardened portion of the coating, the etch-hardened portion disposed along the top region and formed in a hardened state; and
    directing a reactive etch comprising second ions at the fin structure, the second ions having a second trajectory forming a non-zero angle with respect to the perpendicular, wherein the reactive etch removes the etch-hardened portion and the sidewall portion of the coating while not etching the fin, wherein the sidewall portion is removed by the time the etch-hardened portion is removed.

2. The method of claim 1 wherein the finFET is an N-type finFET, and wherein the strained silicon is disposed on a SiGe strain relaxed buffer (SRB) layer.

3. The method of claim 2, wherein after the reactive etch, an exposed fin is formed having a final strain state equal to the initial strain state.

4. The method of claim 1, wherein the second trajectory lies within a first plane, wherein the sidewall regions lie within a second plane, the second plane being perpendicular to the first plane.

5. The method of claim 1, wherein the reactive etch removes the etch-hardened portion at a first etch rate, wherein the first etch rate is less than a second etch rate when the second ions are directed in the reactive etch to the top region of the coating in an unhardened state.

6. The method of claim 5, wherein the reactive etch removes the sidewall portion at a third etch rate, different from the first etch rate.

7. The method of claim 1, wherein the coating comprises silicon nitride, silicon oxynitride, or silicon oxy-carbon-nitride having a thickness in a range of 2 nm to 20 nm, and wherein the implanting the first ions comprises implanting oxygen ions at an ion energy between 250 eV and 1000 eV and an ion dose of between 5 E 14/cm$^2$ and 5 E/16/cm$^2$.

8. The method of claim 1, wherein the coating comprises silicon nitride, silicon oxynitride, or silicon oxy-carbon-nitride having a thickness in a range of 2 nm to 20 nm, and wherein the implanting the first ions comprises implanting silicon ions at an ion energy between 250 eV and 1000 eV and an ion dose of between 5 E 14/cm$^2$ and 5 E/16/cm$^2$.

9. The method of claim 1, wherein the coating comprises silicon nitride or silicon oxynitride, and wherein the implanting the first ions comprises implanting oxygen ions, wherein the etch-hardened portion comprises a peak atomic oxygen concentration of 5 percent to 60 percent.

10. The method of claim 1, wherein the coating comprises silicon nitride or silicon oxynitride, and wherein the implanting the first ions comprises implanting oxygen ions or silicon ions to an implant depth, wherein the coating comprises a coating thickness, and wherein a ratio of implant depth to coating thickness is 0.1 to 1.0.

11. The method of claim 1, wherein the non-zero angle is between 10 degrees and 60 degrees with respect to the perpendicular.

12. The method of claim 1, wherein the finFET device comprises a gate structure covering a portion of the strained silicon fin,
wherein the coating covers the gate structure,
wherein the etch-hardened portion comprises a first etch-hardened portion,
and wherein the implanting the first ions into the coating comprises forming a second etch-hardened portion of the coating, the second etch-hardened portion disposed along a top portion of the gate structure.

13. A method of forming a finFET device, comprising:
providing a fin structure extending from a substrate plane of a substrate, the fin structure comprising:
a semiconductor fin; and
a silicon nitride coating, the silicon nitride coating extending along a top region of the fin; and forming a sidewall portion along sidewall regions of the fin;
implanting oxygen ions into the silicon nitride coating, the oxygen ions having a first trajectory along a perpendicular to the substrate plane, wherein the oxygen ions form an etch-hardened portion of the silicon nitride coating, the etch-hardened portion disposed along the top region and formed in a hardened state, wherein the etch-hardened portion comprises an atomic fraction of oxygen of 5% to 60%; and
directing a reactive etch comprising second ions at the fin structure, the second ions having a second trajectory forming a non-zero angle with respect to the perpendicular, wherein the reactive etch removes the etch-hardened portion at a first etch rate, wherein the first etch rate is less than a second etch rate when the second ions are directed in the reactive etch to the top region of the coating in an unhardened state.

14. The method of claim 13, wherein the silicon nitride coating comprises a thickness in a range of 2 nm to 20 nm, and wherein the implanting the oxygen ions comprises implanting oxygen ions at an ion energy between 250 eV and 1000 eV and an ion dose of between 5 E 14/cm$^2$ and 5 E/16/cm$^2$.

15. The method of claim 13, wherein the silicon nitride coating comprises a coating thickness, wherein the implanting the oxygen ions comprises implanting oxygen ions to an implant depth, and wherein a ratio of implant depth to coating thickness is 0.1 to 1.0.

16. The method of claim 13 wherein the finFET is an N-type finFET, wherein the semiconductor fin comprises strained silicon disposed on a SiGe strain relaxed buffer (SRB) layer.

17. A method of forming a finFET device, comprising:
providing a fin structure extending from a substrate plane of a substrate, the fin structure comprising:
a semiconductor fin; and
a silicon nitride coating, the silicon nitride coating extending along a top region of the fin; and forming a sidewall portion along sidewall regions of the fin;
implanting silicon ions into the silicon nitride coating, the silicon ions having a first trajectory along a perpendicular to the substrate plane, wherein the silicon ions form an etch-hardened portion of the silicon nitride coating, the etch-hardened portion disposed along the top region and formed in a hardened state; and
directing a reactive etch comprising second ions at the fin structure, the second ions having a second trajectory forming a non-zero angle with respect to the perpendicular, wherein the reactive etch removes the etch-hardened portion at a first etch rate, wherein the first etch rate is less than one half of a second etch rate when the second ions are directed in the reactive etch to the top region of the coating in an unhardened state.

18. The method of claim 17, wherein the silicon nitride coating comprises a thickness in a range of 2 nm to 20 nm, and wherein the implanting the silicon ions comprises implanting silicon ions at an ion energy between 250 eV and 1000 eV and an ion dose of between 5 E 14/cm$^2$ and 5 E16/cm$^2$.

* * * * *